(12) United States Patent
Ahn et al.

(10) Patent No.: US 7,843,126 B2
(45) Date of Patent: Nov. 30, 2010

(54) COLOR FILTER PANEL, ORGANIC LIGHT EMITTING DISPLAY APPARATUS AND METHOD OF MANUFACTURING THE SAME

(75) Inventors: Seung-Ho Ahn, Gyeonggi-do (KR); Myung-Jae Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 672 days.

(21) Appl. No.: 11/143,508

(22) Filed: Jun. 1, 2005

(65) Prior Publication Data

US 2005/0269942 A1 Dec. 8, 2005

(30) Foreign Application Priority Data

Jun. 3, 2004 (KR) .................... 10-2004-0040302

(51) Int. Cl.
*H01J 1/62* (2006.01)
*H01J 63/04* (2006.01)

(52) U.S. Cl. .................. 313/504; 313/498; 313/500; 445/24; 445/23

(58) Field of Classification Search .......... 313/498–504
See application file for complete search history.

(56) References Cited

U.S. PATENT DOCUMENTS

| 2001/0025958 A1* | 10/2001 | Yamazaki et al. ............. 257/72 |
| 2003/0107314 A1* | 6/2003 | Urabe et al. ................ 313/506 |
| 2004/0027055 A1* | 2/2004 | Yamazaki et al. ........... 313/498 |

\* cited by examiner

*Primary Examiner*—Nimeshkumar D Patel
*Assistant Examiner*—Thomas A Hollweg
(74) *Attorney, Agent, or Firm*—Innovation Counsel LLP

(57) ABSTRACT

An OLED apparatus includes a substrate, a TFT, a scan line, a data line, a power supply line, a color filter, a pixel electrode, a light emitting layer and a counter electrode. The TFT is formed on the substrate. The scan line transmits a scan signal to a control electrode of the TFT. The data line transmits a data signal to the TFT. Bias voltages are applied to the TFT through the power supply line. The color filter overlaps with one or more of the scan line, the data line and the power supply line. The pixel electrode overlaps with one or more of the scan line, the data line and the power supply line. The light-emitting layer is formed on the pixel electrode. The counter electrode is formed on the light-emitting layer. Therefore, cross talk may be reduced and the opening ratio increased to enhance luminance.

22 Claims, 11 Drawing Sheets

US 7,843,126 B2

COLOR FILTER PANEL, ORGANIC LIGHT EMITTING DISPLAY APPARATUS AND METHOD OF MANUFACTURING THE SAME

CROSS-REFERENCE TO RELATED APPLICATION

This application relies for priority upon Korean Patent Application No. 2004-40302 filed on Jun. 3, 2004, the contents of which are herein incorporated by reference in its entirety.

BACKGROUND OF THE INVENTION

1. Field of the Invention

The present invention relates to a color filter panel, an organic light emitting display (OLED) apparatus having the color filter panel and a method of manufacturing the OLED apparatus.

2. Description of the Related Art

A display apparatus that incorporates a light-emitting device having a light emitting layer interposed between a pair of electrodes has a wide viewing angle and a good display quality. Thus, this type of display apparatus is getting increasing attention as a high-quality display apparatus.

A light emitting mechanism of the light-emitting device often involves combination of holes and electrons. Holes, which correspond to positive charges, are injected into an anode and combined with electrons that are injected into a cathode to form excitons. When the excitons in high-energy state come back to ground energy state, light is generated. The above-described mechanism is commonly referred to as "electro-luminescence."

Electro-luminescence includes fluorescence and phosphorescence. Fluorescence corresponds to a transition from a singlet state to a ground state, and phosphorescence corresponds to a transition from a triplet state to a ground state. The luminance level of electro-luminescence ranges from about thousands of $cd/cm^2$ to about tens of thousands of $cd/cm^2$. Due to this good brightness, using electro-luminescence for a display apparatus has been considered.

The light-emitting layer has a thickness of less than about 1 µm. Furthermore, the light-emitting layer (such as in an OLED) emits a light on its own. Therefore, an OLED apparatus may be thinner and lighter than a liquid crystal display apparatus that does not emit light on its own. While a liquid crystal display apparatus requires a backlight assembly to supply the light, the OLED apparatus does not include a backlight assembly.

Furthermore, the OLED apparatus may employ an active matrix driving method. According to the active matrix driving method, each pixel of the OLED apparatus employs a thin film transistor (TFT) so that the OLED apparatus controls each pixel. This active matrix driving method allows the OLED device to produce high-quality images with no or almost no crosstalk.

In order to display full color, the OLED apparatus may employ one of the following three coloring methods: an RGB light independently emitting type method, a color converting type method, and a color filter type method.

According to the RGB light independently emitting type method, a red light, a green light and a blue light are generated independently from a red light emitting layer, a green light emitting layer and a blue light-emitting layer, respectively.

According to the color converting type method, a blue light is generated from a blue light-emitting layer, and the blue light generated from the blue light-emitting layer is converted into other colors by a color-converting layer that is interposed between the blue light emitting layer and a substrate.

According to the color filter type method, a white light is generated from a light emitting layer, and a red color filter, a green color filter and a blue color filter are disposed between the light emitting layer and a substrate.

According to the RGB light independently emitting type method, the red light emitting layer, the green light emitting layer and the blue light-emitting layer are deposited and patterned independently. However, according to the color filter type method, the color filters are formed through photolithography. Therefore, the color filter type method may obtain higher resolution than that the RGB light independently emitting type method. However, luminance of a light decreases as it passes through the color filters. Therefore, luminance of the color filter type method is lower than that of the RGB light independently emitting type method.

Furthermore, when the color filter type method is applied to a bottom emission type OLED apparatus, a stability caused by encapsulation and a degree of freedom of manufacturing process are high, whereas an opening ratio is reduced to lower luminance. Therefore, when a resolution of the bottom emission type OLED apparatus increases, the luminance of the bottom emission type OLED apparatus is greatly decreased.

SUMMARY OF THE INVENTION

The present invention provides a color filter panel capable of enhancing opening ratio to improve a light utilization efficiency and a luminance.

The present invention also provides an organic light emitting display (OLED) apparatus having the above-mentioned color filter panel.

The present invention also provides a method of manufacturing the above-mentioned color filter panel.

The present invention also provides a method of manufacturing the above-mentioned OLED apparatus.

The present invention also provides a method of manufacturing the above-mentioned color filter panel.

In an exemplary OLED apparatus according to the present invention, the OLED apparatus includes a substrate, a thin film transistor, a scan line, a data line, a power supply line, a color filter, a pixel electrode, a light emitting layer and a counter electrode. The thin film transistor is formed on the substrate. The scan line transmits a scan signal to a control electrode of the thin film transistor. The data line transmits a data signal to the thin film transistor. Bias voltages are applied to the thin film transistor through the power supply line. The color filter overlaps with one or more of the scan line, the data line and the power supply line. The pixel electrode overlaps with one or more of the scan line, the data line and the power supply line. The light-emitting layer is formed on the pixel electrode. The counter electrode is formed on the light-emitting layer.

In an exemplary color filter panel according to the present invention, the color filter panel includes a substrate, a thin film transistor, a scan line, a data line, a power supply line, a color filter and a pixel electrode. The thin film transistor is formed on the substrate. The scan line transmits a scan signal to a control electrode of the thin film transistor. The data line transmits a data signal to the thin film transistor. Bias voltages are applied to the thin film transistor through the power supply line. The color filter overlaps with one or more of the scan line, the data line and the power supply line. The pixel electrode overlaps with one or more of the scan line, the data line and the power supply line.

In an exemplary method of manufacturing an organic light emitting display apparatus according to the present invention, a thin film transistor is formed on a substrate. A scan line that transmits a scan signal to a control electrode of the thin film transistor is formed. A data line that transmits a data signal to the thin film transistor is formed. A power supply line through which bias voltages are applied to the thin film transistor is formed. A color filter that overlaps with one or more of the scan line, the data line and the power supply line is formed. A pixel electrode that overlaps with one or more of the scan line, the data line and the power supply line is formed. A light-emitting layer is formed on the pixel electrode. Then, a counter electrode is formed on the light-emitting layer.

In an exemplary method of manufacturing a color filter panel according to the present invention, a thin film transistor is formed on a substrate. A scan line that transmits a scan signal to a control electrode of the thin film transistor is formed. A data line that transmits a data signal to the thin film transistor is formed. A power supply line through which bias voltages are applied to the thin film transistor is formed. A color filter that overlaps with one or more of the scan line, the data line and the power supply line is formed. A pixel electrode that overlaps with one or more of the scan line, the data line and the power supply line is formed.

According to the present invention, the OLED apparatus includes no layer between the color filter and the pixel electrode. That is, the pixel electrode is formed directly on the color filter. Further, the color filter is interposed between the pixel electrode and the data line or the power supply line to reduce electrical coupling therebetween. Therefore, a cross talk may be reduced.

Furthermore, color filters overlap with each other at a region over the data line or the power supply line. Therefore, no additional light-blocking layer is required, and an opening ratio of the OLED apparatus increases to enhance luminance.

BRIEF DESCRIPTION OF THE DRAWINGS

The above and other features and advantages of the present invention will become more apparent by description in detailed exemplary embodiments thereof with reference to the accompanying drawings, in which.

DESCRIPTION OF EMBODIMENTS

Hereinafter, the embodiments of the present invention will be described in detail with reference to the accompanied drawings.

Figure 1:
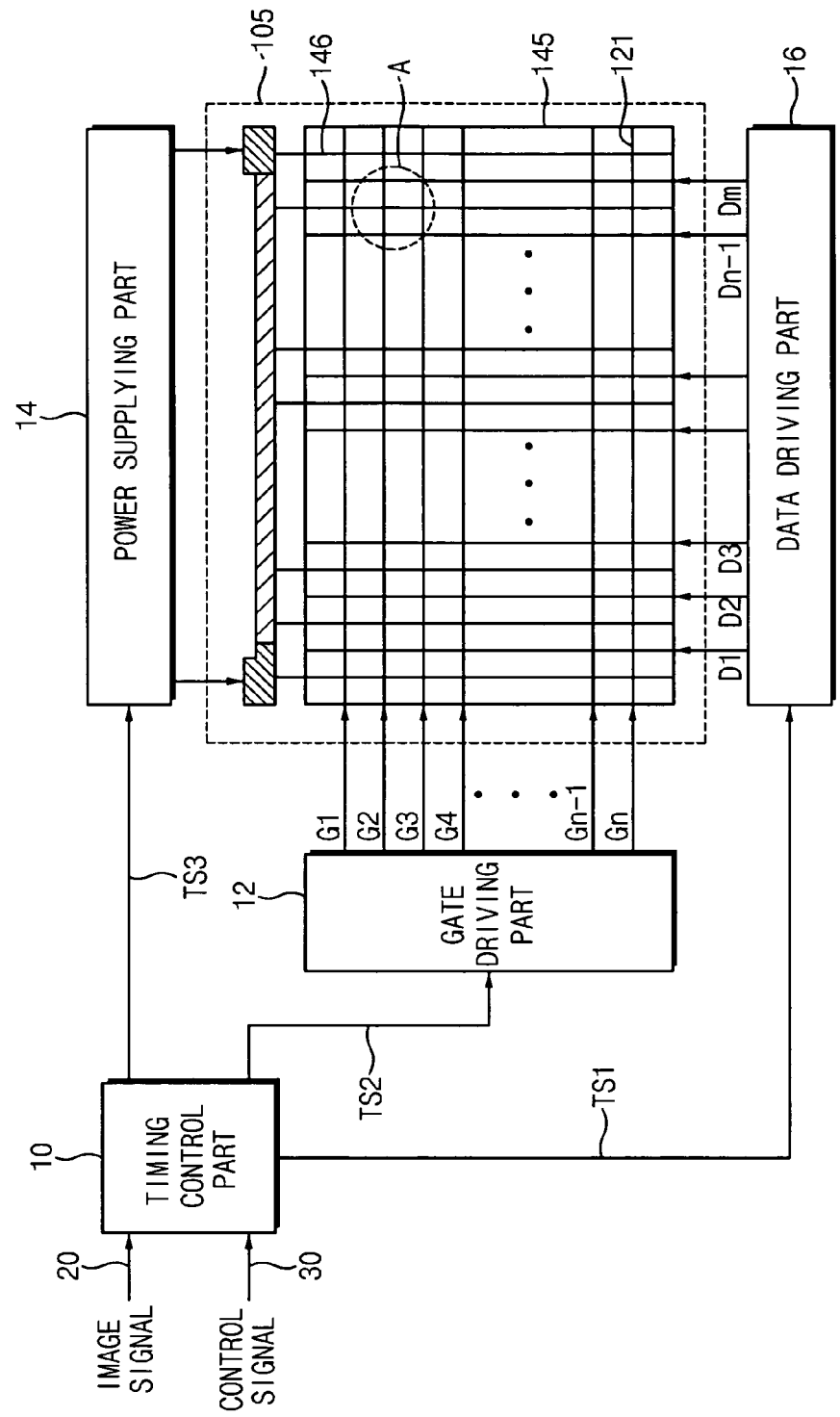
FIG. 1 is a schematic block diagram illustrating an OLED apparatus according to an exemplary embodiment of the present invention.

FIG. 1 is a schematic block diagram illustrating an OLED apparatus according to an exemplary embodiment of the present invention.

Referring to FIG. 1, an OLED apparatus according to an exemplary embodiment of the present invention includes a timing control part 10, a data driving part 16, a gate driving part 12, a power supplying part 14 and an OLED panel 105.

The timing control part 10 receives an image signal 20 and a control signal 30 to generate first and second timing control signals TS1 and TS2. The first timing control signal TS1 and the image signal 20 are applied to the data driving part 16. The second timing control signal TS2 is applied to the gate driving part 12. A third timing control signal TS3 generated from the timing control part 10 is applied to the power supplying part 14.

The data driving part 16 receives the image data 20 and the first timing signal TS1 from the timing control part 10, and applies data signals D1, D2, . . . Dm−1 and Dm to the OLED panel 105.

The gate driving part 12 receives the second timing control signal TS2 from the timing control part 10, and applies scan signals G1, G2, . . . , Gn−1 and Gn to the OLED panel 105 in sequence.

The power supplying part 14 receives the third timing control signal TS3 from the timing control part 10, and applies power to power supply lines of the OLED panel 105. The power supply lines may be arranged in matrix shape through a power supplying part that may be arranged in latitudinal or longitudinal direction.

The power supplying part 14 provides bias voltages. When TFTs formed on the OLED panel 105 correspond to a P-type transistor, the power supplying part 14 provides a bias voltage that is higher than a reference voltage (or ground voltage) that is provided to an organic light emitting device formed on the OLED panel. When the TFTs formed on the OLED panel 105 correspond to a N-type transistor, the power supplying part 14 provides a bias voltage that is lower than the reference voltage.

The OLED panel 105 includes m number of data lines 145 that transmit data signals, m number of power supply line 146 and n number of scan lines 121 that transmit scan signals, so that the OLED panel 105 displays an image on a basis of the scan signal, the data signal and power.

Figure 2:
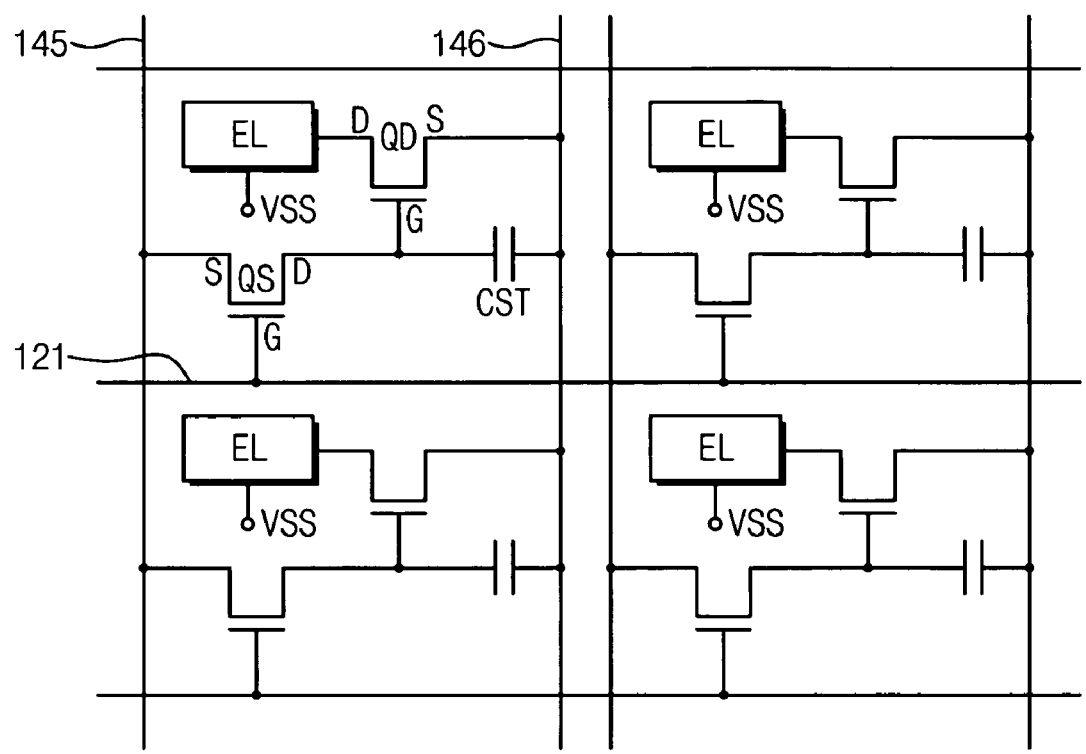
FIG. 2 is an enlarged view illustrating a portion 'A' in FIG. 1.

FIG. 2 is an enlarged view illustrating a portion 'A' in FIG. 1.

Referring to FIG. 2, neighboring data lines 145, neighboring power supply lines 146 and neighboring scan lines 121 define a pixel region. The pixel region includes a switching device QS, a driving device QD, an organic light emitting device EL and a storage capacitor Cst formed thereon.

In detail, the switching device QS includes a source electrode S that is electrically connected to one of the data lines 145, a gate electrode G that is electrically connected to one of the scan lines 121 and a drain electrode D that is electrically connected to a node N1. When a scan signal is applied to the gate electrode G of the switching device QS from the scan line 121, the switching device QS applies the data signal applied to the source electrode S of the switching device QS from the data line 145 to the node N1.

The driving device QD includes a source electrode S that is electrically connected to one of the power supply lines 146, a gate electrode G that is electrically connected to the node N1, and a drain electrode D that is electrically connected to the organic light-emitting device EL. The driving device QD controls current that flows from the source electrode S to the drain electrode D in accordance with data signals applied from the drain electrode D of the switching device QS. Therefore, the driving device QD controls a light emission of the organic light-emitting device EL.

The organic light emitting device EL has a first terminal that is electrically connected to the drain electrode D of the driving device QD, and a second terminal that is electrically connected to a counter electrode VSS. Therefore, the organic light-emitting device EL emits a light corresponding to current induced by a voltage difference between voltages of the first and second terminals.

The storage capacitor Cst includes a first terminal that is electrically connected to the node N1 and a second terminal that is electrically connected to the power supply line that is electrically connected to the source electrode S of the driving device QD, so that the storage capacitor Cst stores the driving voltage.

Hereinafter, a structure of a TFT panel will be explained.

Figure 3:
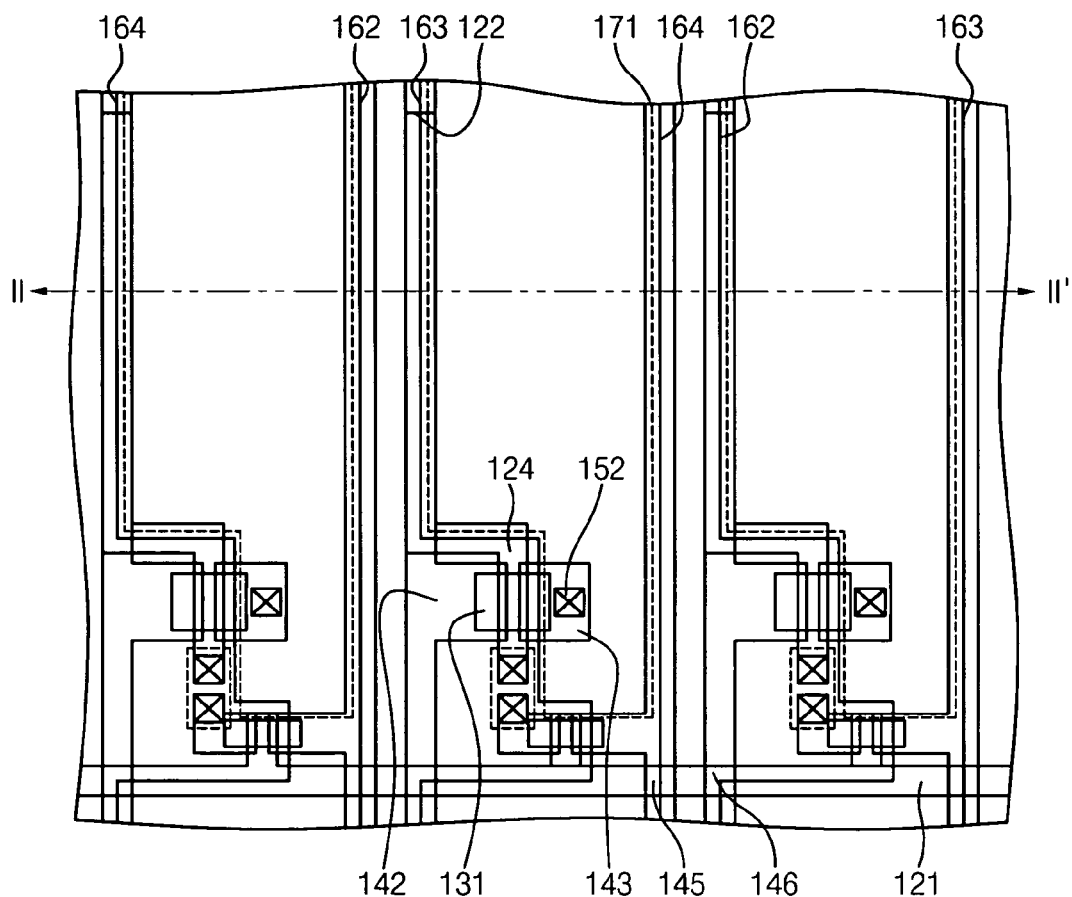
FIG. 3 is a layout illustrating a TFT panel of an OLED according to an exemplary embodiment of the present invention.
Figure 4:
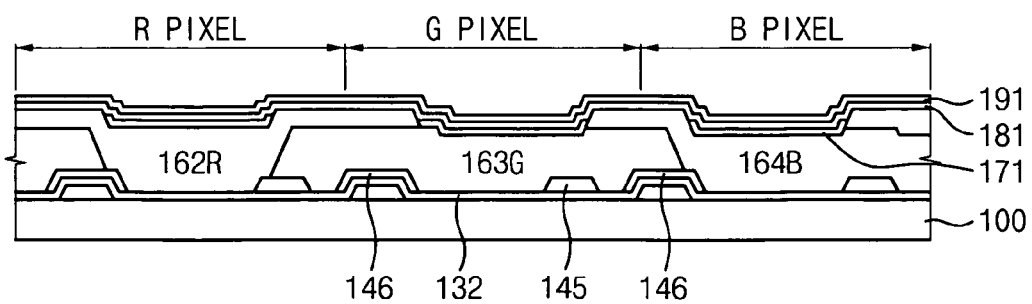
FIG. 4 is a cross-sectional view taken along a line II-II' in FIG. 3.

FIG. 3 is a layout illustrating a TFT panel of an OLED according to an exemplary embodiment of the present invention, and FIG. 4 is a cross-sectional view taken along a line II-II' in FIG. 3. In detail, FIG. 3 shows a portion of the TFT panel, in which a red pixel, a green pixel and a blue pixel are formed.

Referring to FIGS. 3 and 4, a red color filter 162R, a green color filter 163G and a blue color filter 164B may be formed in the pixel region. Each of the color filters may overlap with each other and be positioned over the data lines 145 or the power supply lines 146. The red, green and blue color filters 162R, 163G and 164B may overlap, for example, with a portion of the scan lines 121 or the power supply lines 146. Alternatively, the red, green and blue color filters 162R, 163G and 164B may overlap, for example, with all portions of the scan lines 121 or the power supply lines 146. The red, green and blue color filters 162R, 163G and 164B may be in any order.

The pixel electrode 171 may be formed on the red, green and blue color filters 162R, 163G and 164B such that a portion of the pixel electrode 171 overlaps the data lines 145 and the power supply lines 146. Then, parasitic capacitance between the pixel electrode 171 and the data lines 145 or between the pixel electrode 171 and the power supply lines 146 may be minimized by interposing the red, green and blue color filters 162R, 163G and 164B.

The pixel electrode 171 may overlap, for example, a portion of the scan lines 121, the data lines 145 or the power supply lines 146. Alternatively, the pixel electrode 171 may overlap with all portions of the scan lines 121, the data lines 145, or the power supply lines 146.

In a bottom emission type OLED apparatus, an emission region is defined by the power supply lines 146 and the data lines 145. Therefore, when an opening ratio is enhanced, light utilization efficiency and luminance are also enhanced.

As described above, an opening ratio of the pixel is maximized. Furthermore, only color filters are formed in the pixel, and no additional insulation layer is formed between the pixel electrode 171 and the red, green and blue color filters 162R, 163G and 164B, so that an attenuation of light is minimized and luminance is increased.

FIGS. 5A, 6A, 7A, 8A and 10A are layouts showing a process of manufacturing the TFT panel in FIGS. 3 and 4. FIGS. 5B, 6B, 7B, 8B, 9B and 10B are cross-sectional views taken along lines III-III', IV-IV', V-V', VI-VI', VII-VII' and VIII-VIII' in FIGS. 5A, 6A, 7A, 8A, 9A and 10A, respectively. Especially, FIG. 9B is a cross-sectional view taken along a line VII-VII' in FIG. 9A after only a red color filter is formed. FIG. 9C is another cross-sectional view taken along a line VII-VII' in FIG. 9A after red and green color filters are formed. FIG. 9D is another cross-sectional view taken along a line VII-VII' in FIG. 9A after red, green and blue color filters are formed. The lines III-III', IV-IV', V-V', VI-VI', VII-VII' and VIII-VIII' passes through scan lines 121, a driving device QD and data lines 145.

Figure 5A:
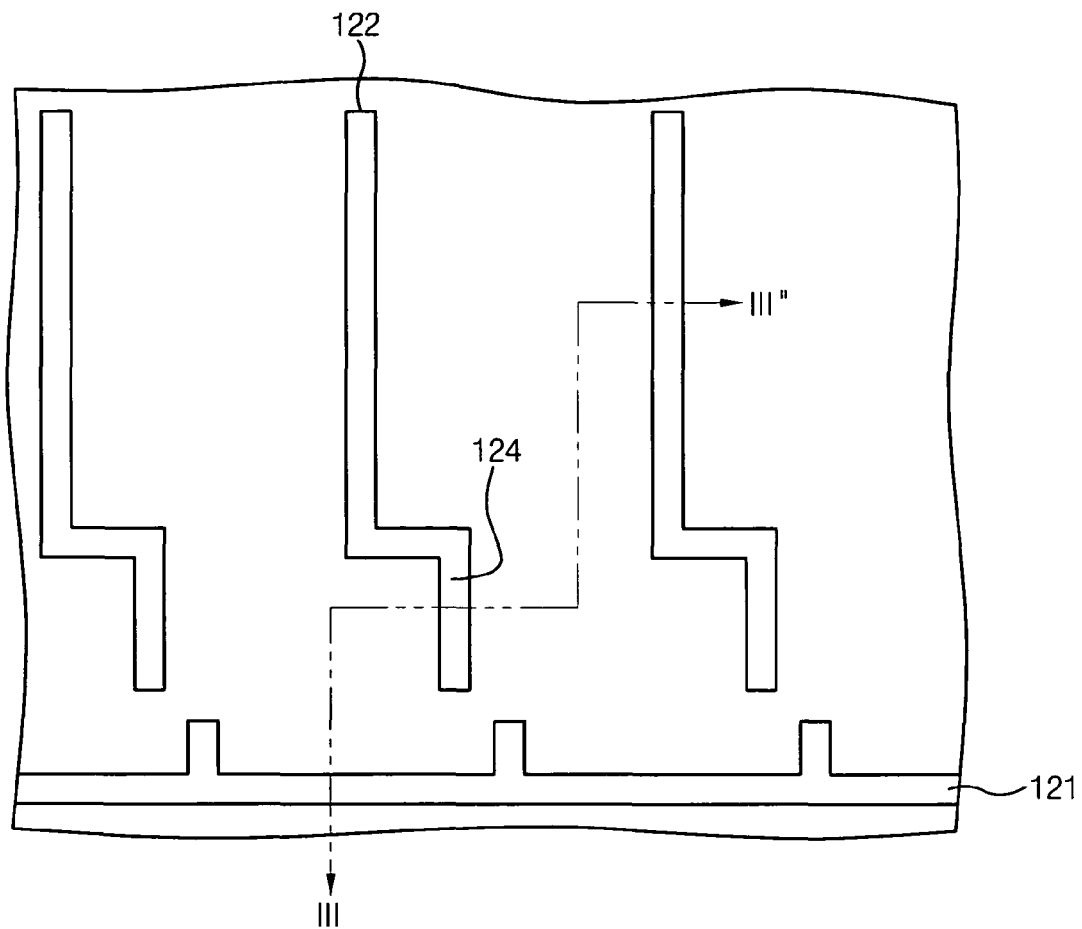
FIGS. 5A, 6A, 7A, 8A and 10A are layouts showing a process of manufacturing the TFT panel in FIGS. 3 and 4.
Figure 5B:
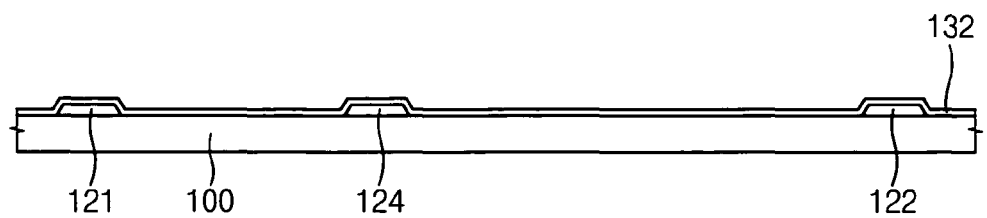
FIG. 5B is a cross-sectional view taken along a line III-III' in FIG. 5A.

Referring to FIGS. 5A and 5B, metal, for example, such as chromium (Cr), molybdenum (Mo), aluminum (Al), silver (Ag) or a mixture thereof is deposited on a transparent substrate 100 through, for example, a sputtering method to form a single layered or double-layered metal layer. The metal layer is patterned to form the scan line 121, a storage capacitor line 122 and a gate electrode 124 of the driving device QD. The metal layer may be patterned through a photolithography method and dry or wet etched. The scan line 121 extends in a first direction and the storage capacitor line 122 extends in a second direction that is substantially perpendicular to the first direction. The gate electrode 124 of the driving transistor QD is connected to the storage capacitor line 122.

A plurality of portions of the scan line 121 protrudes in the second direction to form gate electrodes 124 of a switching device QS. The scan line 121, the storage capacitor line 122 and the gate electrode 124 of the driving transistor QD may be tapered. An end portion of the scan line 121 has wider width than remaining portion of the scan line 121, so that the end portion may operate as a pad for electrically connecting to the gate driving part.

The storage capacitor line 122 overlaps with a power supply line 146 that is to be explained later to form the storage capacitor.

Figure 6A:
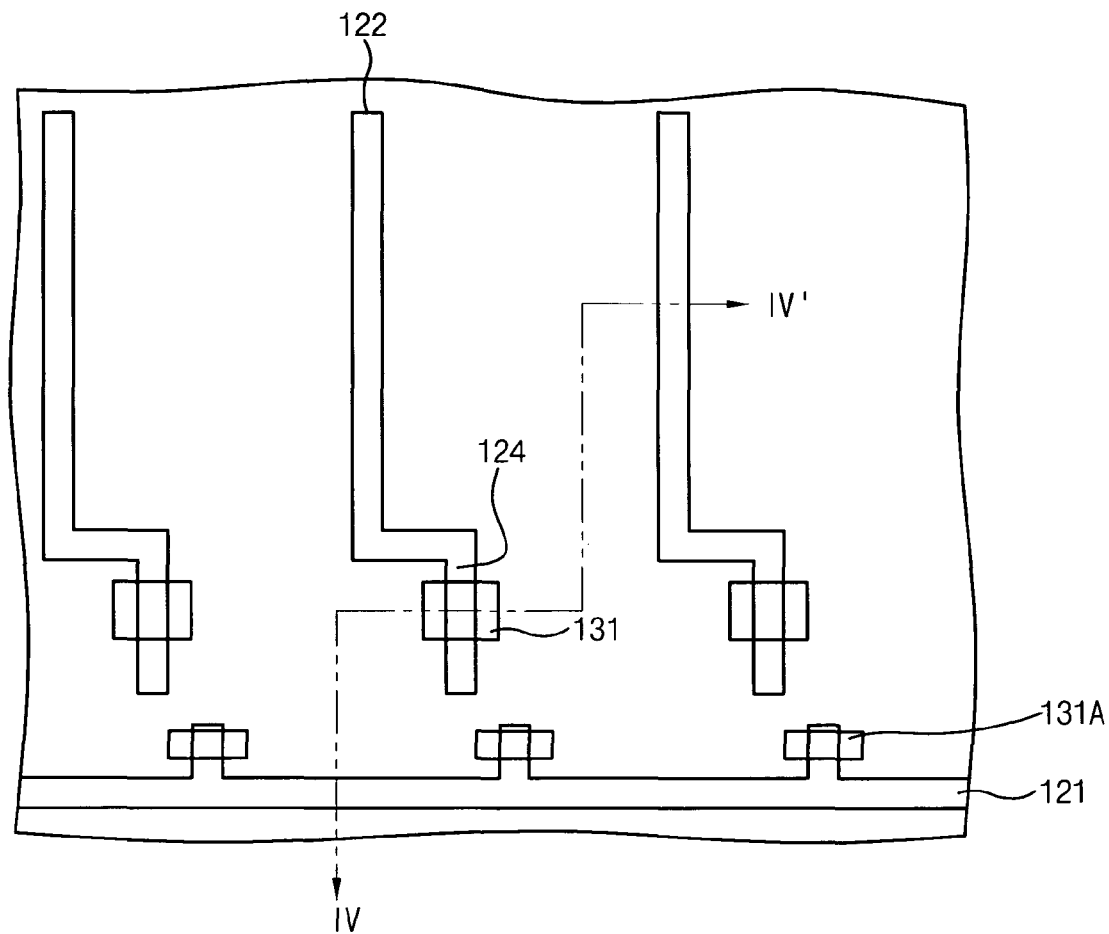
Figure 6B:
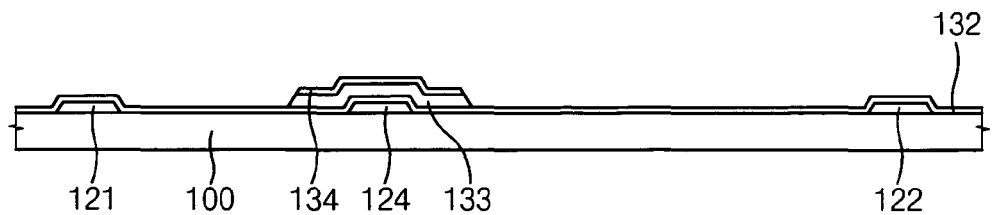
FIG. 6B is a cross-sectional view taken along a line IV-IV' in FIG. 6A.

Referring to FIGS. 6A and 6B, three layers are formed on a transparent substrate 100 having the scan line 121 and the storage capacitor line 122 formed thereon. In detail, a gate insulation layer 132 including silicon nitride or silicon oxide, a semiconductor film such as amorphous silicon hydride film, and amorphous silicon film doped with n-type dopant such as phosphorus (P) are formed in sequence, for example, by chemical vapor deposition (CVD) method.

Then, the amorphous silicon film and the semiconductor film are patterned in sequence, for example, through a photolithography method to form a semiconductor layer 133 and an ohmic contact layer 134. The semiconductor layer 133 may include polysilicon. Alternatively, the semiconductor layer 133 may include a long wire shaped crystallized semiconductor with nano size. The semiconductor layer 133 is extended along the data line 145 that is to be explained later and disposed under the data line 145 and the power supply line 146.

The semiconductor layer 133 may be disposed under a drain electrode 143. Alternatively, the semiconductor layer 133 may overlap with only a TFT having the drain electrode 143 and a source electrode 142, which will be explained later.

The ohmic contact layer 134 including amorphous silicon with dopant or silicide is formed on the semiconductor layer 133.

The ohmic contact layer 134 and the semiconductor layer 133 include a first part 131 disposed over the gate electrode 124 of the driving device QD, and a second part 131a disposed over the gate electrode of the switching device QS.

The first and second parts 131 and 131a are spaced apart from each other. The first and second parts 131 and 131a may have substantially identical shape with each other except for a specific region, as will be described in more detail below.

The semiconductor layer 133 operates as a channel of TFT such as the driving device QD and the switching device QS.

Figure 7A:
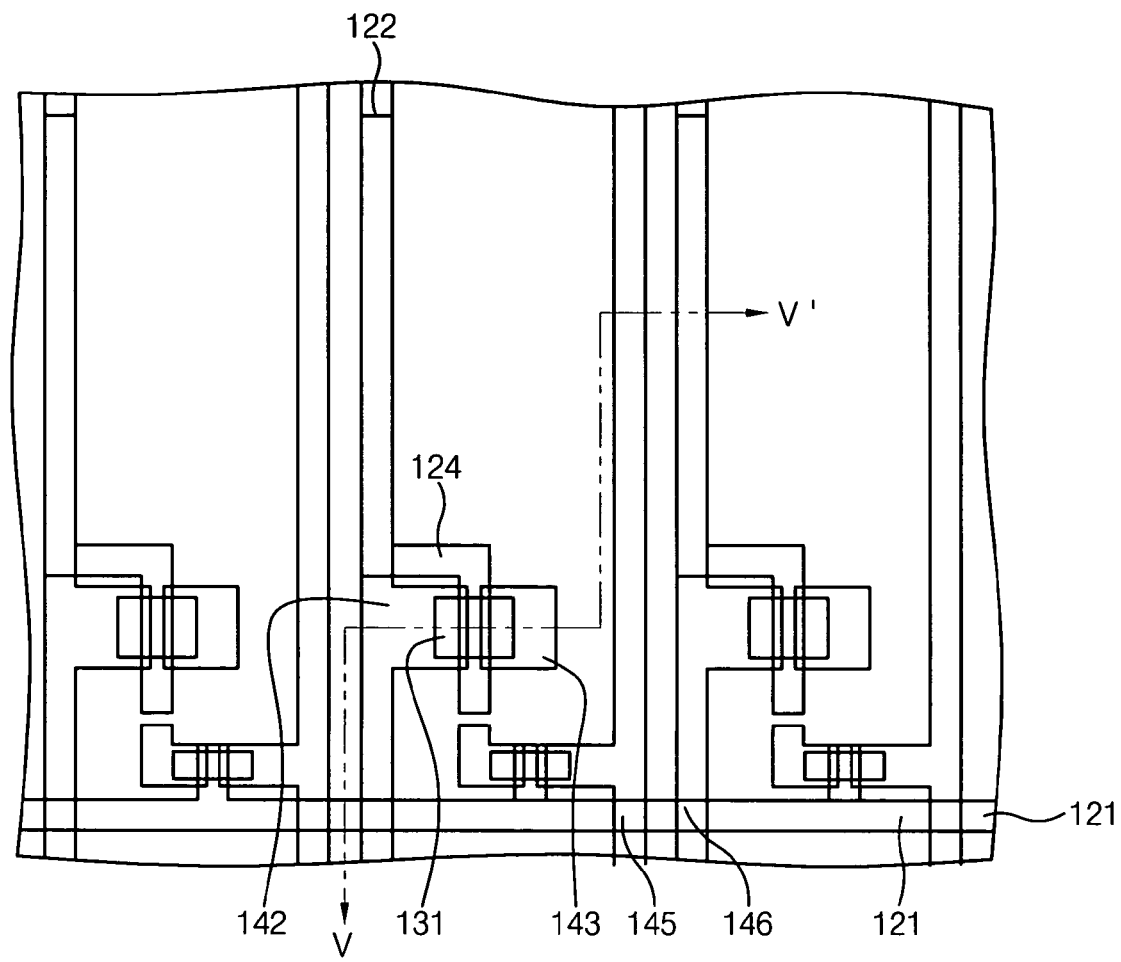

Alternatively, the ohmic contact layer 134 may be formed only on a specific region near the source electrode 142, the drain electrode 143 and the gate electrode 124 in FIG. 7A.

Figure 7B:
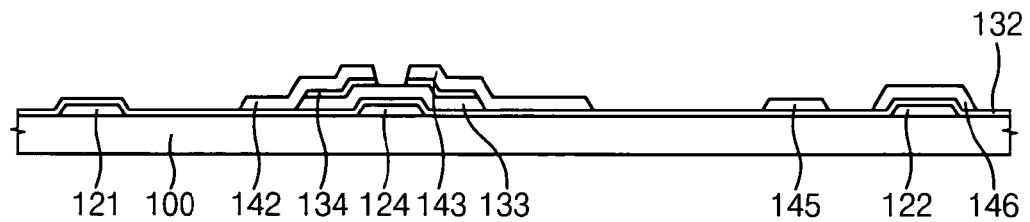
FIG. 7B is a cross-sectional view taken along a line V-V' in FIG. 7A.

Referring to FIGS. 7A and 7B, a metal layer is formed on the transparent substrate 100 having the semiconductor layer 133 and the ohmic contact layer 134 formed thereon. The metal layer may be deposited through a sputtering method.

The metal layer is patterned, for example, through photolithography to form the data line 145 having the source electrode 142 protruding from the data line 145, the drain electrode 143, and the power supply line 146 and other conducting patterns. The data line 145 and the power supply line 146 extend in the second direction that is substantially perpendicular to the first direction (or the scan line 121).

The scan line 121 that transmits a turn-on or turn-off signal, the data line 145 that transmits a data signal, and the power supply line 146 define a pixel region. The source electrode 142 and the drain electrode 143 make contact with the ohmic contact layer 134. An end portion of the data line 145 near the data driving part 16 is wider than the rest of the data line 145 to form a pad that electrically connects the data line 145 to the data driving part 16 in FIG. 1.

According to the present embodiment, the data line 145 and the power supply line 146 are disposed on a same layer. That is, the data line 145 and the power supply line 146 are made from the same layer. In other embodiments, the data line 145 and the power supply line 146 may be formed from different layers.

Subsequently, a portion of the ohmic contact layer 134, which is not covered by the source and drain electrodes 142 and 143, is etched to expose the semiconductor layer 133 between the source and drain electrodes 142 and 143. Therefore, the ohmic contact layer 134 is divided into two portions corresponding to the source and drain electrodes 142 and 143, respectively.

Hereinbefore, the process of forming the TFT corresponding to the driving device QD is explained, and is same as the process of forming the TFT corresponding to the switching device QS. Therefore, any further explanation will be omitted.

According to another embodiment of forming the gate insulation layer 132, the semiconductor layer 133, the ohmic contact layer 134, the source electrode 142 and the drain electrode 143, a single- or multiple-layered metal layer including a metal such as aluminum (Al), silver (Ag), chromium (Cr), molybdenum (Mo) or an alloy thereof is formed. These layers may be formed, for example, by a sputtering method after completing forming the gate insulation layer 132, the semiconductor layer 133, and the ohmic contact layer 134.

A photosensitive layer is then formed on the metal layer. The photosensitive layer is exposed by a mask having patterns, and developed.

In order to form the photosensitive layer having a thicknesses that varies by the exact position, a mask having a translucent area, a light blocking area and a transparent area may be used. The translucent area of the mask may include slit patterns of which distance is less than a resolution of an exposing apparatus, lattice patterns or translucent tape.

This way, the data line 145, the power supply line 146, and the drain electrode 134, etc. may be formed with the mask.

Figure 8A:
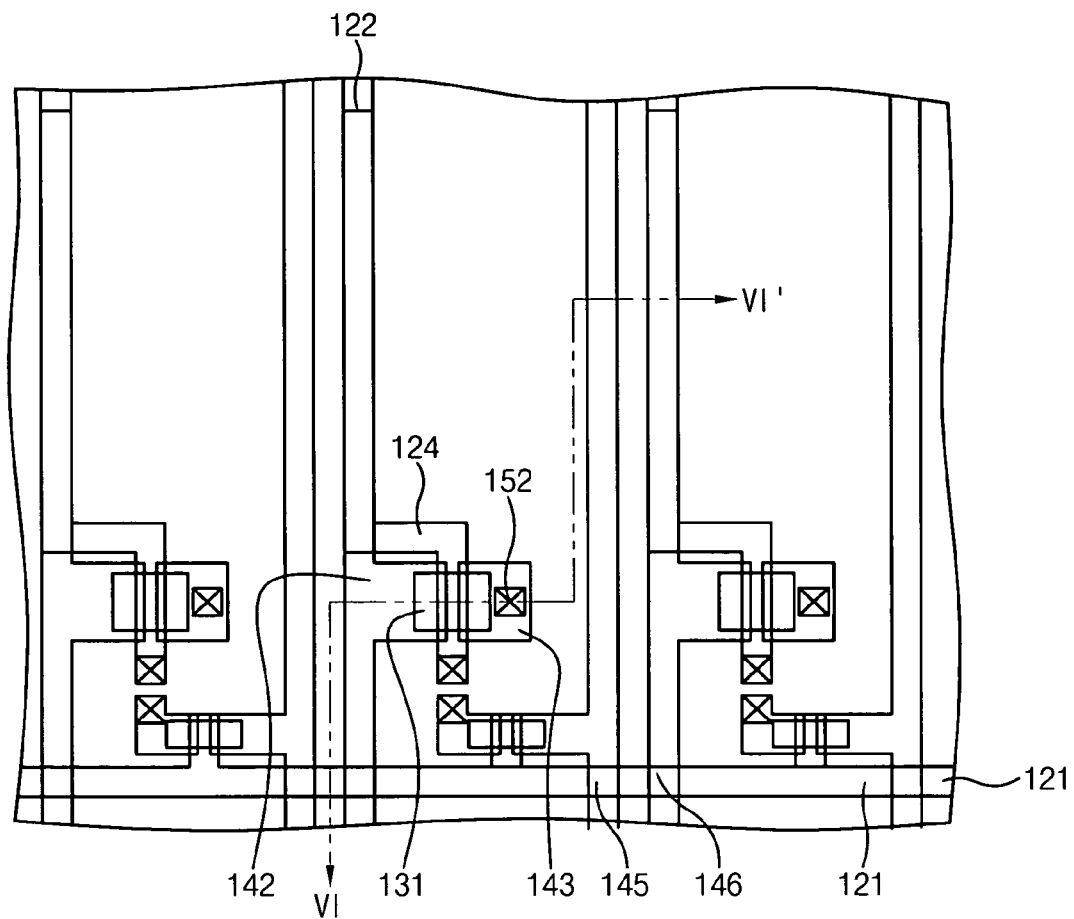
Figure 8B:
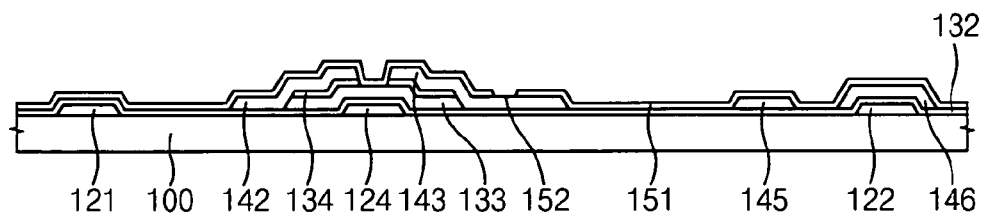
FIG. 8B is a cross-sectional view taken along a line VI-VI' in FIG. 8A.

Referring to FIGS. 8A and 8B, a protection layer 151 may be formed on a portion of the semiconductor layer 133 which is not covered by the data line 145 and the power supply line 146. The protection layer 151 includes a dielectric material, for example, such as silicon oxide, silicon nitride, etc. The protection layer 151 protects the portion of the semiconductor layer 133, and prevents diffusion of pigments or dyes of red, green and blue color filters 162, 163 and 164 that are to be formed.

A portion of the protection layer 151 is etched to form connection holes 152 through which the drain electrode 143 is exposed. The connection holes 152 expose an end portion of the data line 145 and the power supply line 146.

Alternatively, the color filters may be formed on the protection layer 151, before the connection holes 152 are formed, and the color filters and the protection layer 151 may be etched simultaneously to form the connection holes 152.

The protection layer 151 is optional and may not be part of the apparatus in some embodiments.

Referring to FIGS. 9A to 9D, the red, green and blue color filters 162, 163 and 164 are formed on the protection layer 151 along the second direction. The red, green and blue color filters 162, 163 and 164 alternate in named order.

Referring to FIG. 9B, a red color filter layer including a material that transmits only a red light is formed on the transparent substrate 100 having the protection layer 151 formed thereon, and the red color filter layer is patterned to form the red color filter 162 and the connection holes 152. The red color filter 162 is formed in n-th pixel region, wherein 'n' is a natural number.

Referring to FIG. 9C, a green color filter layer including a material that transmits only a green light is formed on the transparent substrate 100 having the red color filter 162 formed thereon, and the green color filter layer is patterned to form the green color filter 163 and the connection holes 152. The green color filter 163 is formed in (n+1)-th pixel region.

Referring to FIG. 9D, a blue color filter layer including a material that transmits only a blue light is formed on the transparent substrate 100 having the green color filter 163 formed thereon, and the blue color filter layer is patterned to form the blue color filter 164 and the connection holes 152. The blue color filter 164 is formed in (n+2)-th pixel region.

An order of forming the red, green and blue color filters 162, 163 and 164 may be changed. The red, green and blue color filters 162, 163 and 164 are not formed at the end portions of the scan line 121, the data line 145 and the power supply lines 146.

Referring to FIGS. 9C and 9D, portions of the color filters 162, 163 and 164 are overlapped. Furthermore, portions of the color filters 162, 163 and 164 cover the data line 145 and the power supply line 146. As a result of this partial overlap, the panel is thicker at regions in which the red, green and blue color filters 162, 163 and 164 are overlapped than in the other regions.

As shown in FIGS. 9B to 9D, a protruding portion due to overlapping of the red, green and blue color filters 162, 163 and 164 are tapered. The protruding portion that corresponds to an overlapping portion of the red, green and blue color filters 162, 163 and 164 blocks light together with the data line 145 and the power supply line 146. Therefore, light does not leak through a region between the pixels.

Furthermore, the edge portions of the color filters disposed at each pixel region overlaps with each other to form a light-blocking pattern, so that light leakage is prevented. That is, no separate light-blocking pattern is required. Therefore, a process of manufacturing the OLED apparatus may be simplified. Furthermore, a viewing angle may be widened to enhance a display quality.

Figure 9A:
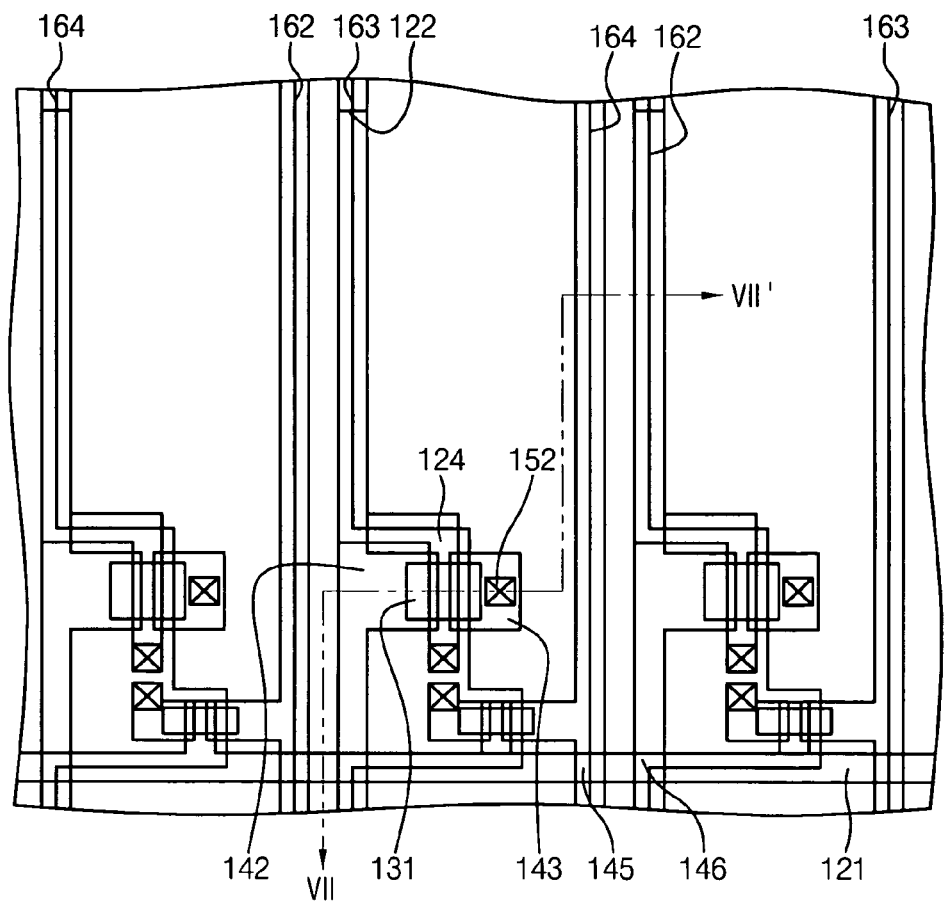
FIG. 9B is a cross-sectional view taken along a line VII-VII' in FIG. 9A after only a red color filter is formed.
FIG. 9C is another cross-sectional views taken along a line VII-VII' in FIG. 9A after red and green color filters are formed.
FIG. 9D is another cross-sectional views taken along a line VII-VII' in FIG. 9A after red, green and blue color filters are formed.
Figure 9B:
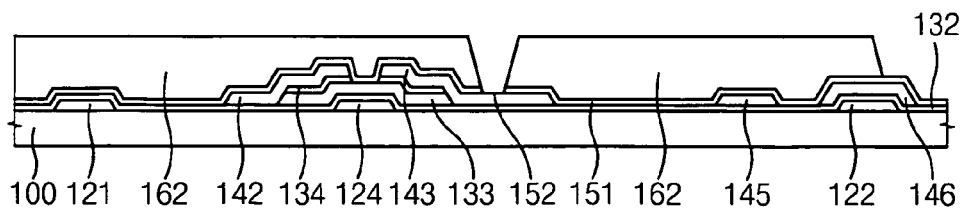
Figure 9C:
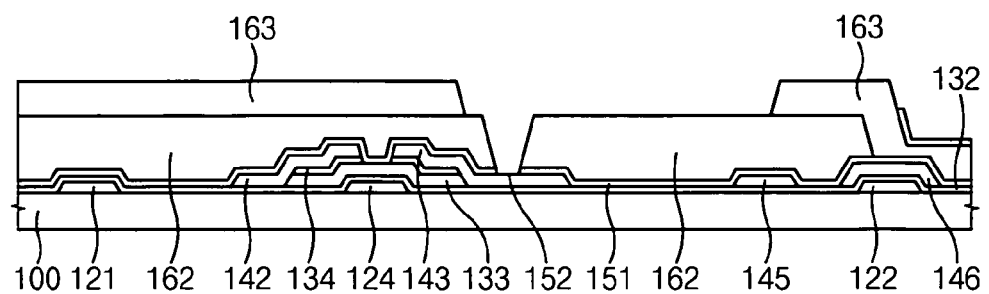
Figure 9D:
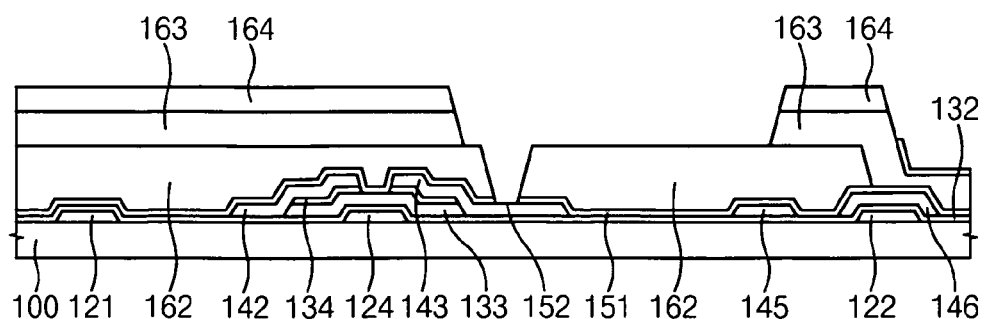

Referring to FIGS. 9A to 9C, the red, green and blue color filters 162, 163 and 164 cover a portion or a whole of the TFT. That is, the red, green and blue color filters 162, 163 and 164 are disposed over the TFT.

Referring to FIG. 9C, at least two color filters, for example, red and green color filters 162 and 163, overlap with each other to prevent light from entering the channel layer from the light-emitting layer. At least two color filters overlapped with each other may cover the channel layer of the TFT.

Referring to FIG. 9D, three color filters that are the red, green and blue color filters 162, 163 and 164 cover the channel layer of the TFT. That is because the amorphous silicon transistor has lower mobility and lower stability than those of a polysilicon transistor.

An OLED apparatus that is driven by current displays an image by controlling the amount of current that flows through a light-emitting device. Therefore, a leakage current caused by light may induce deterioration of display quality.

According to the present invention, at least two color filters overlap with each other to block the light that advances toward the channel layer. Therefore, the display quality may be enhanced.

Figure 10A:
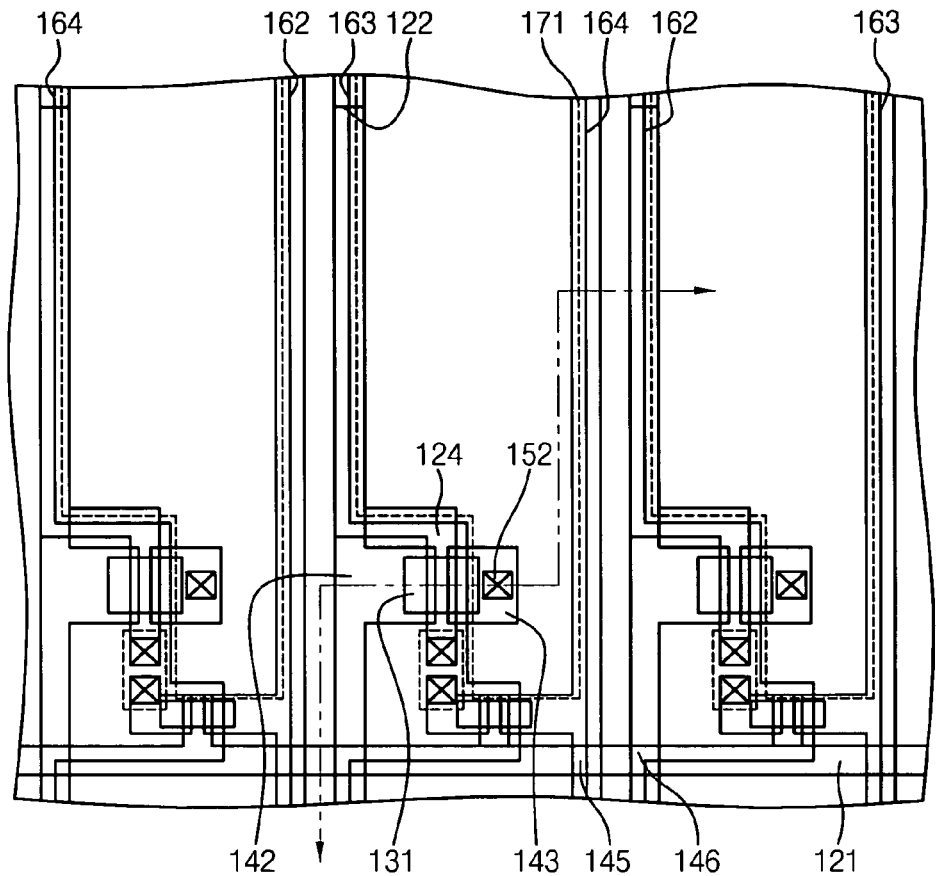
Figure 10B:
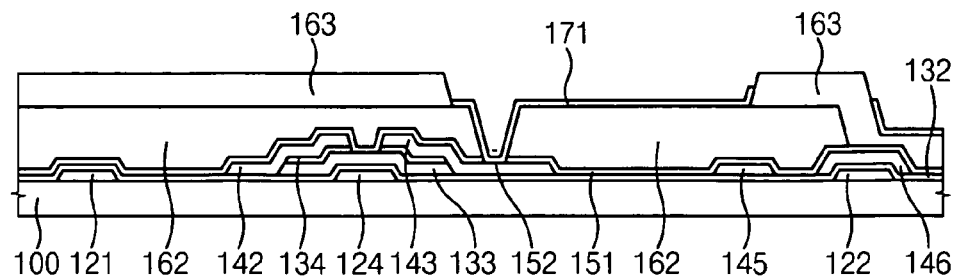
FIG. 10B is a cross-sectional view taken along a line VIII-VIII' in FIG. 10A.

Referring to FIGS. 10A and 10B, a pixel electrode 171 is formed on the red, green and blue color filters 162, 163 and 164. The pixel electrode 171 includes an optically transparent and electrically conductive material, for example, such as indium tin oxide (ITO), indium zinc oxide (IZO), etc. A transparent and conductive layer including ITO or IZO is formed on the red, green and blue color filters 162, 163 and 164. The transparent and conductive layer is patterned, for example, by a photolithography method to form the red, green and blue color filters 162, 163 and 164 that are electrically connected to the drain electrode 143 of the driving device QD through the connection hole 152 and to form the connection pad (not shown) at the end portions of the scan line 121, the data lines 145 and the power supply line 146.

The driving device QD applies a driving signal to the pixel electrode 171 that operates as an anode or a cathode.

The transparent and conductive layer also electrically connects between patterns exposed through the connection holes 152. For example, the transparent and conductive layer may electrically connect the driving device QD and the switching device QS.

Referring to FIG. 10B, the pixel electrode 171 is formed such that edge portions of the pixel electrode 171 overlap with the data line 145 and the power supply line 146. Preferably, portions of the pixel electrode 171 may be disposed at tapered portion of the red, green and blue color filters 162, 163 and 164 to increase the area of the pixel electrode 171. Therefore, an amount of current that flows between the pixel electrode 171 and a counter electrode (not shown) facing the pixel electrode 171 increases.

The edge portions of the pixel electrodes 171 are bent along the tapered portion of the red, green and blue color filters 162, 163 and 164, and overlapping portions of the red, green and blue color filters 162, 163 and 164 isolate the pixel electrodes 171 from each other. Therefore, a parasitic capacitance between the pixel electrodes 171 is reduced, while maximizing an opening ratio.

According to the present invention, no additional layer is interposed between the pixel electrode 171 and the red, green and blue color filters, 162, 163 and 164, while maximizing the opening ratio. Therefore, an amount of light that is used for displaying an image may be maximized to enhance luminance.

That is, in the bottom emission type OLED, an emission region is defined by the power supply lines 146 and the data lines 145. Therefore, luminance may be enhanced by maximizing the opening ratio.

When a distance between the data lines 145 and the pixel electrodes 171 decreases, a parasitic capacitance between the data lines 145 and the pixel electrodes 171 may cause a deterioration of display quality. In order to prevent the deterioration of the display quality, at least two color filter layers overlapped with each other are interposed between the data lines 145 and the pixel electrodes 171.

The end portions of the scan lines 121, the data lines 145 and the power supply lines 146 make contact the transparent and conductive layer that corresponds to a connection pad through the connection holes 152. The scan lines 121, the data lines 145 and the power supply lines 146 are electrically connected to the gate driving part 12, the data driving part 16 and the power supplying part 14 through the connection pads, respectively.

Figure 11:
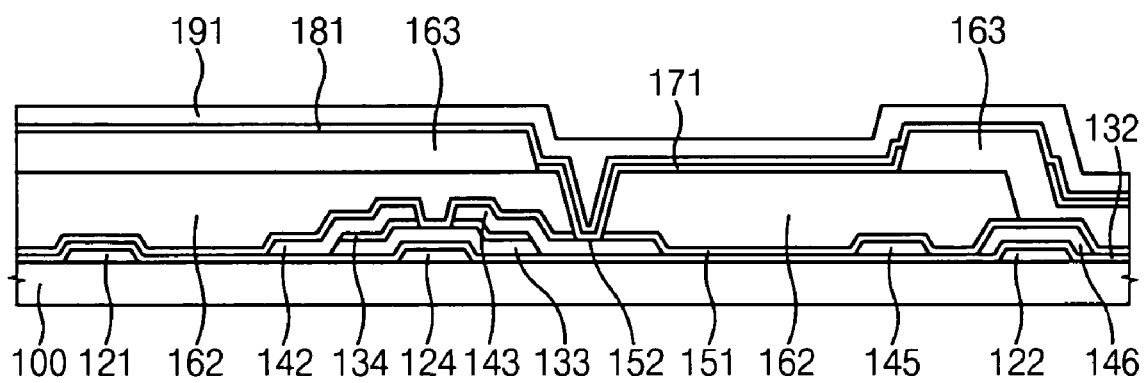
FIG. 11 is a cross-sectional view taken along a line VIII-VIII' in FIG. 10A, after forming a light emitting layer and a counter electrode.

FIG. 11 is a cross-sectional view taken along a line VIII-VIII' in FIG. 10A, after forming a light emitting layer and a counter electrode.

Referring to FIG. 11, an organic light-emitting layer 181 is formed on the pixel electrode 171. The organic light emitting layer 181 includes a hole injected layer, a hole transportation layer, a light emitting layer and an electron transportation layer positioned in that order. Alternatively, the organic light emitting layer 181 may include a hole transportation layer, a light emitting layer and an electron transportation layer piled in that order, or the organic light emitting layer 181 may include a hole injected layer, a hole transportation layer, a light emitting layer, an electron transportation layer and an electron injected layer piled in that order.

The organic light-emitting layer 181 emits a white light, and colors are represented by the red, green and blue color filters 162, 163 and 164.

The organic light-emitting layer 181 includes organic light emitting material, phosphorescent body and nano-sized crystal light emitting body. The nano-sized crystal light emitting body includes the organic light material having a core and a cell structure corresponding to a group 3-group 5 combination and a group 2-group 6 combination in the periodic table.

When the organic light emitting layer 181 is formed, the counter electrode 191 including metal is formed on the organic light emitting layer 181. The counter electrode 191 operates as an anode or a cathode. The counter electrode 191 also protects the organic light emitting layer 181 from moisture. For example, a material including magnesium (Mg), lithium (Li) and calcium (Ca) and having a low work function is deposited on the organic light emitting layer 181 to form a cathode, and a protection electrode for protecting the cathode and combining the cathode to another cathode is formed.

When the OLED apparatus is a bottom emission type, the cathode preferably includes a metal.

According to the present invention, the OLED apparatus includes no layer between the color filter and the pixel electrode. The pixel electrode is formed directly on the color filter. Further, the color filter is interposed between the pixel electrode and the data line or the power supply line to reduce coupling therebetween. Therefore, a cross talk may be reduced.

Furthermore, color filters overlap each other in the region disposed over the data line or the power supply line. Therefore, no additional light-blocking layer is required and an opening ratio increases to enhance luminance.

Having described the exemplary embodiments of the present invention and its advantages, it is noted that various changes, substitutions and alterations can be made herein without departing from the spirit and scope of the invention as defined by the appended claims.

What is claimed is:

1. An organic light emitting display (OLED) apparatus comprising:
    a substrate;
    a thin film transistor formed on the substrate;
    a scan line that transmits a scan signal to a control electrode of the thin film transistor;
    a data line that transmits a data signal to the thin film transistor;
    a power supply line through which bias voltages are applied to the thin film transistor;
    a plurality of color filters that overlap one or more of the scan line, the data line and the power supply line, ones of the color filters having first portions generally parallel to a surface of the substrate, and at least two tapered portions each overlapping another of the color filters, the tapered portions of the color filters generally angled with respect to the surface of the substrate;
    a plurality of pixel electrodes that directly contact both the first portions and the tapered portions of the color filters and overlap one or more of the scan line, the data line and the power supply line;
    a light-emitting layer continuously formed on at least two of the pixel electrodes; and
    a counter electrode formed on the light emitting layer,
    wherein edge portions of the pixel electrodes are disposed along the tapered portions of the color filters.

2. The OLED apparatus of claim 1, wherein the color filters comprise a red color filter, a green color filter and a blue color filter, and one or more of the red, green and blue color filters overlap with each other at a region disposed over one or more of the scan line, the data line and the power supply line.

3. The OLED apparatus of claim 2, wherein the pixel electrode corresponds to an optically transparent and electrically conductive layer, and the pixel electrode overlaps with one or more of the red, green and blue color filters.

4. The OLED apparatus of claim 1, wherein the light-emitting layer comprises an organic substance, an inorganic substance or a phosphorescent body.

5. The OLED apparatus of claim 4, wherein the inorganic substance comprises a cell of nano-size and a crystal of core structure.

6. The OLED apparatus of claim 1, further comprising a silicon nitride layer interposed between the color filters, and drain and source electrodes of the thin film transistor.

7. The OLED apparatus of claim 6, wherein the silicon nitride layer has a substantially same pattern as that of the color filters.

8. The OLED apparatus of claim 1, wherein the scan line, the data line and the power supply line comprise metal that is opaque.

9. The OLED apparatus of claim 1, wherein the thin film transistor comprises a semiconductor layer including amorphous silicon layer, nano-wire crystalline silicon or polycrystalline silicon.

10. The OLED apparatus of claim 9, wherein two or more color filters overlap each other at a region disposed over the semiconductor layer of the thin film transistor.

11. The OLED apparatus of claim 9, further comprising an ohmic contact layer interposed between the semiconductor layer and drain and source electrodes of the thin film transistor.

12. The OLED apparatus of claim 1, wherein the counter electrode is made of material having a low work function.

13. The OLED apparatus of claim 1 wherein the color filters comprise at least three differently colored color filters, wherein the thin film transistor is covered by the at least three differently colored color filters simultaneously.

14. A color filter panel comprising:
    a substrate;
    a thin film transistor formed on the substrate;
    a scan line that transmits a scan signal to a control electrode of the thin film transistor;
    a data line that transmits a data signal to the thin film transistor;
    a power supply line through which bias voltages are applied to the thin film transistor;
    a plurality of color filters that overlap one or more of the scan line, the data line and the power supply line, ones of the color filters having first portions generally parallel to a surface of the substrate, and at least two tapered portions each overlapping another of the color filters, the tapered portions of the color filters generally angled with respect to the surface of the substrate;
    a plurality of pixel electrodes that directly contact both the first portions and the tapered portions of the color filters and overlap one or more of the scan line, the data line and the power supply line; and
    a light-emitting layer continuously covering at least two of the pixel electrodes,
    wherein edge portions of the pixel electrodes are disposed along the tapered portions of the color filters.

15. The color filter panel of claim 14, further comprising a silicon nitride layer interposed between the color filters, and drain and source electrodes of the thin film transistor.

16. The color filter panel of claim 14, further comprising a semiconductor layer including at least one of an amorphous silicon layer, a crystalline silicon nanowire, and a polycrystalline silicon layer.

17. The color filter panel of claim 16, further comprising an ohmic contact layer interposed between the semiconductor layer and drain and source electrodes of the thin film transistor.

18. A method of manufacturing an organic light emitting display apparatus, comprising:
    forming a thin film transistor on a substrate;
    forming a scan line that transmits a scan signal to a control electrode of the thin film transistor;
    forming a data line that transmits a data signal to the thin film transistor;
    forming a power supply line through which bias voltages are applied to the thin film transistor;
    forming a plurality of color filters that overlap one or more of the scan line, the data line and the power supply line, ones of the color filters having first portions generally parallel to a surface of the substrate, and at least two tapered portions each overlapping another of the color filters, the tapered portions of the color filters generally angled with respect to the surface of the substrate;
    forming a plurality of pixel electrodes that directly contact both the first portions and the tapered portions of the color filters, overlap one or more of the scan line, the data line and the power supply line;

forming a light emitting layer on at least two of the pixel electrodes, the light emitting layer continuously formed on the at least two pixel electrodes; and forming a counter electrode on the light-emitting layer, wherein edge portions of the pixel electrodes are disposed along the tapered portions of the color filters.

19. The method of claim 18, further comprising forming a silicon nitride layer interposed between the color filters, and drain and source electrodes of the thin film transistor.

20. The method of claim 18, further comprising forming an ohmic contact layer interposed between a semiconductor layer and drain and source electrodes of the thin film transistor.

21. The method of claim 18, wherein the counter electrode is made of material having a low work function.

22. A method of manufacturing a color filter panel, comprising:

forming a thin film transistor on a substrate;

forming a scan line that transmits a scan signal to a control electrode of the thin film transistor;

forming a data line that transmits a data signal to the thin film transistor;

forming a power supply line through which bias voltages are applied to thin film transistor;

forming a plurality of color filters that overlap one or more of the scan line, the data line and the power supply line, ones of the color filters having first portions generally parallel to a surface of the substrate, and at least two tapered portions each overlapping another of the color filters, the tapered portions of the color filters generally angled with respect to the surface of the substrate; and forming a plurality of pixel electrodes that directly contact both the first portions and the tapered portions of the color filters, and that overlap one or more of the scan line, the data line and the power supply line; and forming a light-emitting layer continuously covering at least two of the pixel electrodes, wherein edge portions of the pixel electrodes are disposed along the tapered portions of the color filters.

* * * * *